(12) United States Patent
Gelman et al.

(10) Patent No.: US 11,664,731 B2
(45) Date of Patent: May 30, 2023

(54) CONFIGURABLE-SPEED MULTI-PHASE DC/DC SWITCHING CONVERTER WITH HYSTERESIS-LESS PHASE SHEDDING AND INDUCTOR BYPASS

(71) Applicant: Chaoyang Semiconductor (Shanghai) Co., Ltd., Shanghai (CN)

(72) Inventors: Anatoly Gelman, San Diego, CA (US); Taner Dosluoglu, New York, NY (US); Bertrand Diotte, San Diego, CA (US)

(73) Assignee: CHAOYANG SEMICONDUCTOR (SHANGHAI) CO., LTD., Yangpu District (CN)

( * ) Notice: Subject to any disclaimer, the term of this patent is extended or adjusted under 35 U.S.C. 154(b) by 0 days.

(21) Appl. No.: 16/992,781

(22) Filed: Aug. 13, 2020

(65) Prior Publication Data
US 2021/0050789 A1     Feb. 18, 2021

Related U.S. Application Data

(60) Provisional application No. 62/885,992, filed on Aug. 13, 2019.

(51) Int. Cl.
| | |
|---|---|
| *H02M 3/158* | (2006.01) |
| *G05F 1/59* | (2006.01) |
| *H03K 5/24* | (2006.01) |
| *H02M 1/00* | (2006.01) |
| *H02M 3/156* | (2006.01) |

(52) U.S. Cl.
CPC ............ *H02M 3/1584* (2013.01); *G05F 1/59* (2013.01); *H03K 5/24* (2013.01); *H02M 1/0009* (2021.05); *H02M 1/0025* (2021.05); *H02M 3/1566* (2021.05)

(58) Field of Classification Search
CPC ............ H02M 3/1584; H02M 3/1566; H02M 1/0009; H02M 1/0025
See application file for complete search history.

(56) References Cited

U.S. PATENT DOCUMENTS

| | | | |
|---|---|---|---|
| 7,109,689 B2 | 9/2006 | Schneider | |
| 9,496,787 B2 | 11/2016 | Ihs et al. | |
| 2017/0324332 A1* | 11/2017 | Molari | G05F 1/46 |
| 2018/0358891 A1* | 12/2018 | Diotte | H02M 1/08 |
| 2020/0366203 A1* | 11/2020 | Mei | H02M 3/33507 |

\* cited by examiner

*Primary Examiner* — Jeffrey A Gblende
*Assistant Examiner* — Lakaisha Jackson
(74) *Attorney, Agent, or Firm* — KOS IP Law LLP

(57) ABSTRACT

Some embodiments provide a multi-phase DC/DC switching converter in which each of the phases are controlled using a common comparator for comparing an output voltage of the switching converter and a reference voltage, with in some embodiments each of the phases including a bypass switch for coupling ends of an output inductor of the switching converter. Some embodiments provide a multi-phase DC/DC switching converter in which some of the phases are operated with clock signals having frequencies different than clock signals used for operating others of the phases. Some embodiments provide a multi-phase DC/DC switching converter in which some of the phases include inductors having inductances different than inductances for inductors of others of the phases.

15 Claims, 6 Drawing Sheets

CONFIGURABLE-SPEED MULTI-PHASE DC/DC SWITCHING CONVERTER WITH HYSTERESIS-LESS PHASE SHEDDING AND INDUCTOR BYPASS

CROSS REFERENCE TO RELATED APPLICATION

This application claims the benefit of the filing date of U.S. Provisional Patent Application No. 62/885,992, filed on Aug. 13, 2019, the disclosure of which is incorporated by reference herein.

BACKGROUND OF THE INVENTION

The present invention relates generally to DC/DC switching converters, and more particularly to multi-phase DC/DC switching converters.

DC/DC switching converters may be used to provide regulated power to a load, for example one or more processor cores. For some devices, for example handheld smartphones, power required by the load for proper operation may vary significantly during course of operation of the circuitry making up the load. Some DC/DC switching converter architectures include a plurality of parallel switching paths in providing power. Such a DC/DC switching converter may be considered a multi-phase DC/DC switching converter, with each of the switching paths, with for example its own inductor path, considered a phase of the DC/DC switching converter.

Control circuitry for or of the converter generally controls operations of the phases of the switching converter, for example based on output voltage of the converter and possibly other operating characteristics such as current provided to the load and other factors. Unfortunately, such circuitry may exhibit inaccuracies, delayed responses, and part-to-part variations and changes in operation due to temperature variations. These difficulties may result in efficiency dips at static levels of output load, and well as efficiency dips at dynamically changing levels of output load.

BRIEF SUMMARY OF THE INVENTION

Some embodiments provide a multi-phase DC/DC switching converter in which each of the phases are controlled using a common comparator for comparing an output voltage of the switching converter and a reference voltage, with in some embodiments each of the phases including a bypass switch for coupling ends of an output inductor of the switching converter when the bypass switch is in a conducting (closed) state.

Some embodiments provide a multi-phase DC/DC switching converter in which some of the phases are operated with clock signals having frequencies different than clock signals used for operating others of the phases. Some embodiments provide a multi-phase DC/DC switching converter in which some of the phases include inductors having inductances different than inductances for inductors of others of the phases. In some such embodiments, phases with different inductor inductances are operated with clock signals having different frequencies. In some such embodiments, clock signals having higher frequencies are used for phases with inductors having lower inductances, and clock signals having lower frequencies are used for phases with inductors having higher inductances. In some such embodiments, phases with inductors having lower inductances are used to provide power only when the switching converter is operating in a discontinuous conduction mode. In some such embodiments, phases with inductors having lower inductances are used to provide power when an output voltage of the switching converter is equal to or lower than some predetermined positive or negative threshold quantity with respect to reference voltage, while the phases with lower inductances are not switching and consequently not delivering power to a load.

Some embodiments provide a multi-phase DC/DC switching converter, with each phase including a bypass switch coupling ends of an output inductor, where a signal from a comparator for comparing output voltage and a reference voltage is used in controlling all of the phases of the switching converter. In some embodiments the output inductors have different inductance values. In some embodiments the output inductors are run at different frequency. In some embodiments the output inductors inductor have different inductor values and are run at different frequency. In some embodiments power device stages of different phases are sized differently depending on the inductance value of the output inductors for the different phases. In some embodiments the power device stages of different phases are sized differently depending on the frequency of operation of the different phases. In some embodiments the power device stages of phases are sized differently depending on output inductor inductance and the frequency of operation of the different phases.

Some embodiments provide a multi-phase DC/DC switching converter, with each phase including a bypass switch coupling ends of an output inductor, where a signal from a comparator comparing output voltage and a reference voltage is used in controlling some of the phases of the switching converter and a signal from an additional comparator for comparing output voltage and a reference voltage plus a threshold is used in controlling one or more other phases of the switching converter. In some embodiments the output inductors have different inductance values. In some embodiments the output inductors are run at different frequency. In some embodiments the output inductors have different inductance values and are run at different frequency. In some embodiments power device stages of different phases are sized differently depending on the inductance value of the output inductors for the different phases. In some embodiments the power device stages of different phases are sized differently depending on the frequency of operation of the different phases. In some embodiments the power device stages of phases are sized differently depending on output inductor inductance and the frequency of operation of the different phases. In some embodiments the one or more other phases use the signal from the comparator, and not the signal from the additional comparator, and the one or more other phases are limited to providing only a discontinuous conduction mode (DCM) of operation. In some embodiments one or more phases use the signal from the additional comparator, and not the signal from the comparator, and the one or more phases are limited to providing only discontinuous conduction mode (DCM) of operation. In some embodiments the phases that use the signal from the comparator are running at lower frequencies and better light load efficiency. In some embodiments the phases that use signal from the comparator have a larger inductance value for output inductors compared to an inductance value for output inductors of the other phases. In some embodiments differences in output inductor inductance values are due to high volume production component mismatch of the output inductors. In some embodiments differences in output inductor inductance values are intentional and optimized to match the requirements of a final product. In some embodiments the converter makes use of digital current sensing (for example as in U.S. Pat. No. 9,461,543, the disclosure of which is incorporated by reference) to track transition between DCM and continuous conduction mode (CCM) operation in real time, without impacting the control operation of the switching converter in some embodiments. In some embodiments mismatch of inductances of the output inductors and/or other changes in the electrical parameters are tracked for each phase. In some embodiments switching frequency and nominal duty cycle for the phases is changed periodically to adapt to changes in the operating conditions, aging, or other variations of inductor electrical parameters.

Some embodiments provide a multi-phase DC/DC switching converter, with each phase including a bypass switch coupling ends of an output inductor, where a signal from a comparator comparing output voltage and a reference voltage is used in controlling some of the phases of the switching converter and signals from an additional comparator (VCPSH0) for comparing output voltage and a reference voltage plus a threshold and from another additional comparator (VCPSH1) is used in controlling one or more other phases of the switching converter. In some embodiments the output inductors have different inductance values. In some embodiments the output inductors are run at different frequency. In some embodiments the output inductors have different inductor values and are run at different frequency. In some embodiments power device stages of different phases are sized differently depending on the inductance value of the output inductors for the different phases. In some embodiments the power device stages of different phases are sized differently depending on the frequency of operation of the different phases. In some embodiments the power device stages of phases are sized differently depending on output inductor inductance and the frequency of operation of the different phases. In some embodiments the one or more other phases use the signal from the comparator, and not the signal from the additional comparator, and the one or more other phases are limited to providing only a discontinuous conduction mode (DCM) of operation. In some embodiments one or more phases use the signal from the additional comparator, and not the signal from the comparator, and the one or more phases are limited to providing only discontinuous conduction mode (DCM) of operation. In some embodiments the phases that use the signal from the comparator are running at lower frequencies and better light load efficiency. In some embodiments the phases that use signal from the comparator have a larger inductance value for output inductors compared to an inductance value for output inductors of the other phases. In some embodiments differences in output inductor inductance values are due to high volume production component mismatch of the output inductors. In some such embodiments differences in output inductor inductance values are intentional and optimized to match the requirements of a final product. In some embodiments the converter makes use of digital current sensing (for example as in U.S. Pat. No. 9,461,543, the disclosure of which is incorporated by reference) to track transition between DCM and continuous conduction mode (CCM) operation in real time, without impacting the control operation of the switching converter in some embodiments. In some embodiments mismatch of inductances of the output inductors and/or other changes in the electrical parameters are tracked for each phase. In some embodiments switching frequency and nominal duty cycle for the phases is changed periodically to adapt to changes in the operating conditions, aging, or other variations of inductor electrical parameters.

Some embodiments provide a multi-phase DC/DC switching converter comprising:

a plurality of phases, with each phase including at least one high side switch and at least one low side switch coupled in series between an input voltage source and a lower voltage source, an output inductor with a first end coupled to a node between the at least one high side switch and the at least one low side switch and a second end providing an output, and a bypass switch coupling the first end and the second end of the output inductor, with a nominal inductance of at least one of the output inductors different than nominal inductance of at least one other of the output inductors; a comparator for comparing voltage of the output voltage and a reference voltage; and a controller configured to command operation of the at least one high side switch, the at least one low side switch, and the bypass switch of each phase based on an output of the comparator and a clock signal, the clock signal being one of a plurality of different clock signals differing in frequency for at least some of the phases. In some embodiments sizes of the at least one high side switch of different ones of the phases differ in relation to differences in inductance of the output inductors of the different ones of the phases. In some embodiments the sizes of the at least one high side switch of different ones of the phases differ in relation to differences in frequency for the clock signal to be used in operating the at least one high side switch, the at least one low side switch, and the bypass switch of different ones of the phases. In some embodiments sizes of the at least one high side switch of different ones of the phases differ in relation to differences in inductance of the output inductors of the different ones of the phases.

Some embodiments provide a multi-phase DC/DC switching converter, comprising: a plurality of phases, with each phase including at least one high side switch and at least one low side switch coupled in series between an input voltage source and a lower voltage source, an output inductor with a first end coupled to a node between the at least one high side switch and the at least one low side switch and a second end providing an output, and a bypass switch coupling the first end and the second end of the output inductor, with inductance of at least one of the output inductors different than inductance of at least one other of the output inductors; a first comparator for comparing output voltage and a reference voltage; an additional comparator for comparing output voltage and the reference voltage plus a threshold; a controller configured to command operation of the at least one high side switch, the at least one low side switch, and the bypass switch of some of the phases based on an output of the comparator and at least a first clock signal, to command operation of the at least one high side switch, the at least one low side switch, and the bypass switch of one or more others of the phases based on an output of the additional comparator and at least a second clock signal, the second clock signal differing in frequency from the first clock signal. In some embodiments the controller is configured to determine relative inductance of the output inductors of the phases. In some such embodiments the controller is configured to change a duty cycle of operation of the at least one high side switch, the at least on low side switch, and the bypass switch based on the determined relative inductance of the output inductors of the phases. In some such embodiments the controller is configured to select at least one clock signal for use in operating the at least one high side switch, the at least on low side switch, and the bypass switch of at least one phase based on the determined relative inductance of the output inductors of the phases.

These and other aspects of the invention are more fully comprehended upon review of this disclosure.

DETAILED DESCRIPTION

Figure 1:
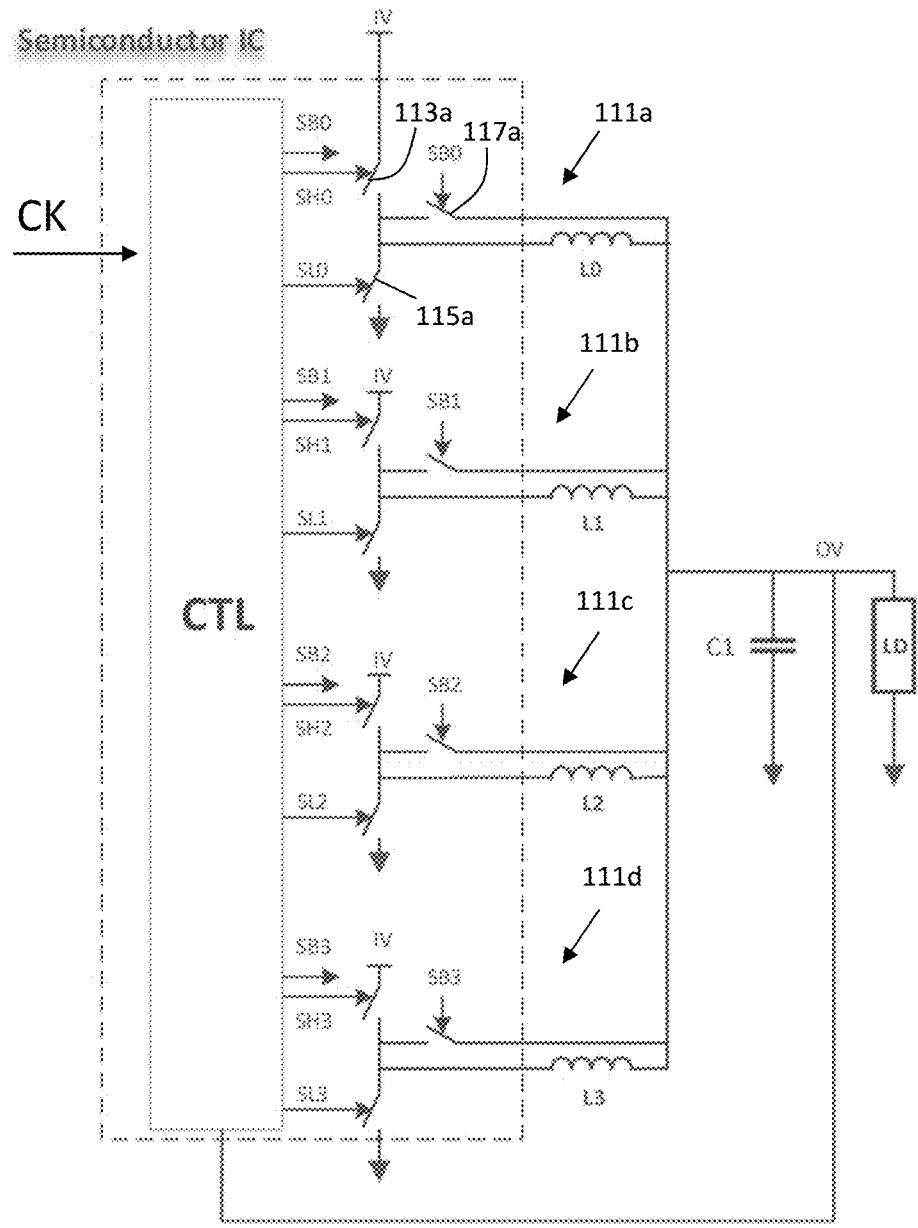
FIG. 1 is a semi-schematic, semi-block diagram of a multi-phase voltage regulation circuit, coupled to a load, in accordance with aspects of the invention.

FIG. 1 is a semi-schematic, semi-block diagram of a multi-phase voltage regulation circuit, coupled to a load, in accordance with aspects of the invention. In the embodiment illustrated in FIG. 1, a multi-phase DC/DC converter includes a plurality of switching phases 111a-d, each including its own inductor path. Four switching phases are shown for convenience, in various embodiments there may be fewer phases or more phases. Each of the switching phases includes a high side switch and a low side switch (e.g., high side switch 113a and low side switch 115a) connected in series between an input voltage source IV and a lower voltage source. In some embodiments the input voltage source is a power supply source, and in some embodiments the lower voltage source is a ground. For each switching phase, an output inductor L0-L3 has a first end coupled to a node between the high side switch and the low side switch. A second end of each of the inductors is commonly coupled to an output capacitor (which can be implemented as a bank of capacitors connected in parallel) C1, which is in parallel to a load LD. In addition, each switching phase includes a bypass switch (e.g., bypass switch 117a) coupling the first end and second end of the output inductor, when the bypass switch is in a closed (conducting) state.

The high side switch, low side switch, and bypass switches are commanded to change states by a controller CTL. The controller may be in the form of a processor, for example, but in many instances the controller is instead or in addition implemented using for example a custom integrated circuit (IC). In most embodiments the controller activates the switches for different inductor paths of the DC-DC switching converter at different times. In various embodiments, for each individual phase, the controller operates the switches using pulse width modulation and/or pulse frequency modulation, with generally either only one or none of the high side and low side switches being closed at any given time, with the bypass switch closed at some times when both the high side switch and the low side switch are open. The duty cycle or pulse frequency will generally be based on a comparison of an output voltage OV provided to the load with a desired reference voltage. In the embodiment of FIG. 1, a period or frequency upon which operation of the switches may be based may depend on clock signals of a same frequency provided to the controller, illustrated in FIG. 1 as a CK signal provided to the controller. In various embodiments, the CK signal will be multiple clock signals, each at the same frequency but phase-shifted to one another, for example by 90 degrees in the embodiment of FIG. 1, with four phases.

In the embodiment of FIG. 1, all inductors L0-L3 have same inductance. In some embodiments one more of the inductors L0-L3 have an inductance different than inductance of others of the inductors. In some embodiments each of the inductors L0-L3 have a different inductance. In some embodiments inductance of an inductor with a greatest inductance is four times inductance of an inductor with a least inductance. In some embodiments nominal inductance of an inductor with a greatest nominal inductance is four times nominal inductance of an inductor with a least nominal inductance. In some embodiments nominal inductance is intended inductance of an inductor, with actual inductance of the inductor being different due to manufacturing variations or tolerances, or due to operating conditions such as temperature or load current.

In some embodiments, sizes of the switching components, or just the high side switches and low side switches or just the high side switches in some embodiments, varies for each phase depending on inductance values, or nominal inductance values, for inductors of those stages. For example, in some embodiments, sizes of transistors making up the high side switches and low side switches may be larger for phases with larger inductors than sizes of transistors making up the high side switches and low side switches for phases with smaller inductors.

Figure 2:
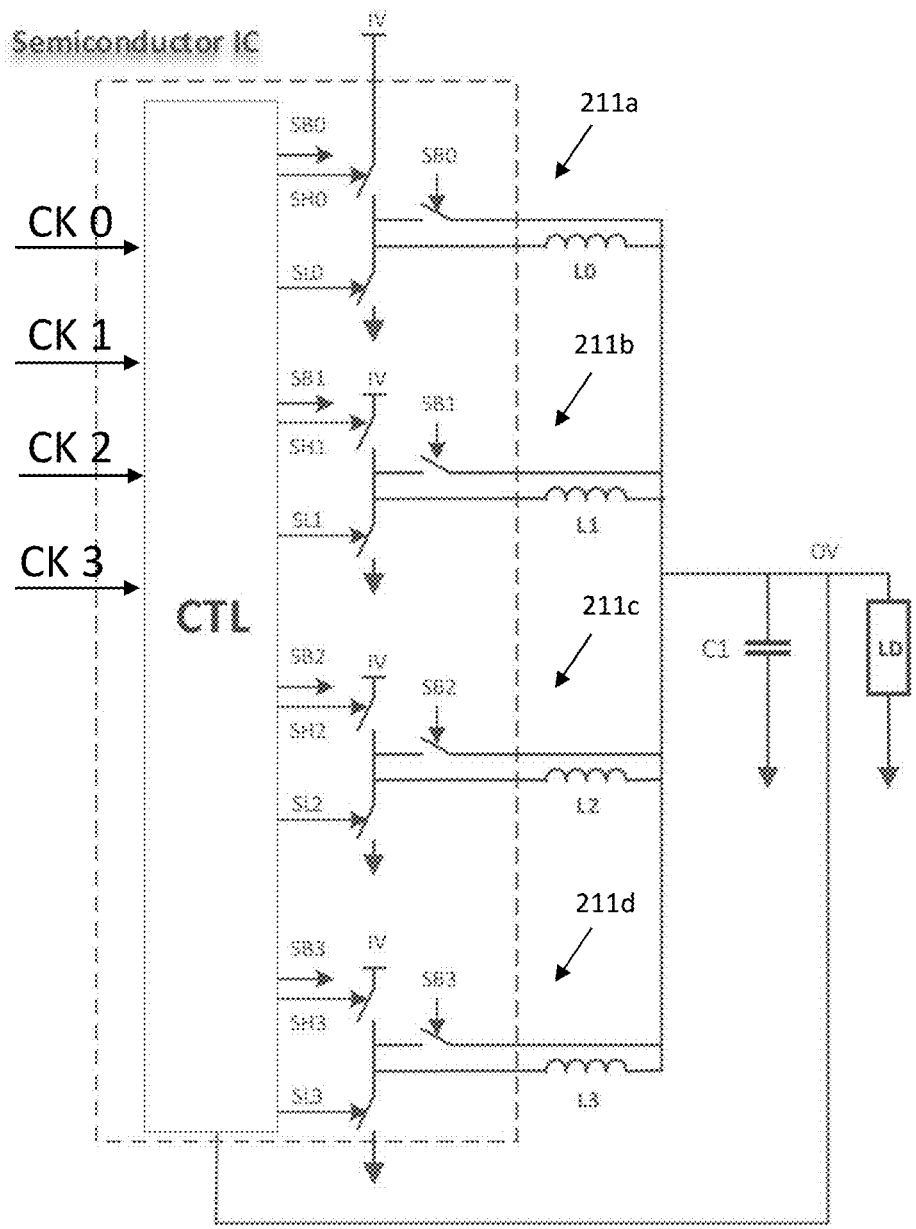
FIG. 2 is a semi-schematic, semi-block diagram of a further multi-phase voltage regulation circuit, coupled to a load, in accordance with aspects of the invention.

FIG. 2 is a semi-schematic, semi-block diagram of a further multi-phase voltage regulation circuit, coupled to a load, in accordance with aspects of the invention. As with the embodiment illustrated in FIG. 1, the embodiment of FIG. 2 shows a multi-phase DC/DC converter including a plurality of switching phases 211a-d, each including its own inductor path. Four switching phases are shown for convenience, in various embodiments there may be fewer phases or more phases. As in the embodiment of FIG. 1, each of the switching phases includes a high side switch and a low side switch connected in series between an input voltage source IV and a lower voltage source. In some embodiments the input voltage source is a power supply source, and in some embodiments the lower voltage source is a ground. For each switching phase, an output inductor L0-L3 has a first end coupled to a node between the high side switch and the low side switch. A second end of each of the inductors is commonly coupled to an output capacitor C1, which is in parallel to a load LD. In addition, each switching phase includes a bypass switch coupling the first end and second end of the output inductor, when the bypass switch is in a closed (conducting) state. A controller operates the switches using pulse width modulation and/or pulse frequency modulation, generally for example as discussed with respect to FIG. 1.

Differing from FIG. 1, in the embodiment of FIG. 2 the controller receives a plurality of clock signals, four clock signals CK0-3 in FIG. 2. In some embodiments different ones of the plurality of clock signals is used in operation of switches of different phases of the converter. In some embodiments of the converter of FIG. 2, the clock signal CK0 is used in operation of the switches of phase 0, the clock signal CK1 is used in operation of phase 1, the clock signal CK2 is used in operation of phase 2, and the clock signal CK3 is used in operation of phase 3. At least one or more of the clock signals are at frequencies different than frequencies of others of the clock signals. In some embodiments a highest frequency, or highest range of frequencies, of the clock signals is two times a lowest frequency of the clock signals. In some embodiments a highest frequency, or highest range of frequencies, of the clock signals is three times a lowest frequency of the clock signals. In some embodiments a highest frequency, or highest range of frequencies, of the clock signals is four times a lowest frequency of the clock signals. In some embodiments a highest range of frequencies for the clock signals is between 8-10 MHz, and the lowest range of frequencies is between 2-2.5 MHz in some embodiments, between 2.6-3.3 MHz in some embodiments, and between 4-5 MHz in some embodiments. In some embodiments inductors for phases utilizing the highest frequency or range of frequencies have an inductance four times an inductance of inductors for phases utilizing the lowest frequency or lowest range of frequencies.

Figure 3:
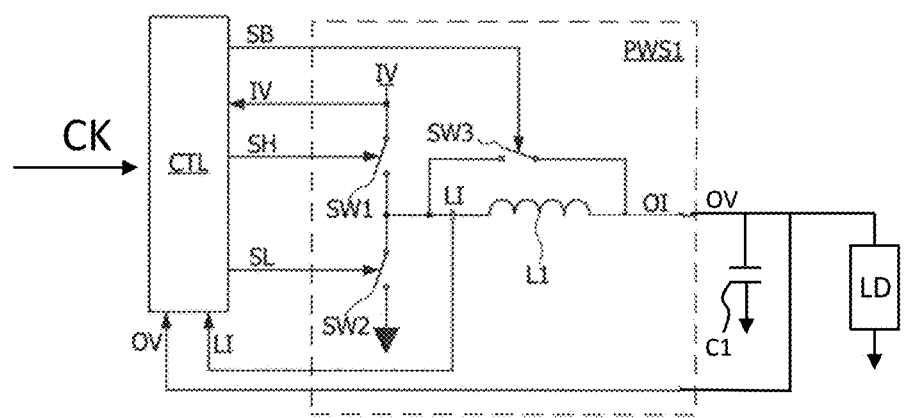
FIG. 3 is a semi-block diagram semi-schematic diagram showing circuitry of a single phase of multi-phase DC/DC switching converter, along with aspects of a controller, common output capacitor, and load, according to an embodiment.

FIG. 3 is a semi-block diagram semi-schematic diagram showing circuitry of a single phase of multi-phase DC/DC switching converter, along with aspects of a controller, common output capacitor, and load, according to an embodiment. In some embodiments the single phase is one of the phases of the embodiments of the multi-phase switching converters of FIG. 1 or 2. The single phase of FIG. 3 includes switches SW1, SW2, SW3, and an inductor L1. A control circuit CTL controls the switches SW1, SW2, SW3. A first terminal of the switch SW1 is connected to a voltage source providing an input voltage IV. A second terminal of the switch SW1 is connected to a first terminal of the inductor L1, a first terminal of the switch SW2 and a first terminal of the switch SW3. A second terminal of the switch SW2 is connected to a low voltage source, e.g. the ground. A second terminal of the inductor L1 is connected to a second terminal of the switch SW3, and to a first terminal of an output capacitor C1, which supplies an output voltage OV to a terminal of a load LD having another terminal connected to the ground. The output voltage OV is lower than the input voltage IV. The second terminal of the capacitor C1 is connected to the ground. The control circuit CTL may receive a measure signal of output voltage OV and input voltage IV. In some embodiments, current intensity measures of the current LI flowing through the inductor L1 may be provided to the control circuit CTL with input and output voltages IV, OV. In some embodiments a measure signal of a current intensity of the current OI flowing through load LD could also be provided to control circuit CTL. The control circuit CTL outputs control signals SH, SL and SB, for controlling the switches SW1, SW2 and SW3, respectively. The control circuit CTL is configured to generate the control signals SH, SL, SB as a function of input and output voltages IV, OV, and the inductor current LI, and possibly the load current OI. The control signals SH, SL, SB are exclusive in closing the switches SW1, SW2, SW3, so that at any time not more than one of the switches SW1, SW2, SW3 is closed whereas the others of the switches SW1, SW2, SW3 are open. For this to happen, the control circuit CTL may turn off all the switches SW1, SW2, SW3 before turning on one of the latter. However some applications may require simultaneous closing of the switches SW3 and SW1 or SW3 and SW2. For example, the switches SW1, SW2, SW3 may be formed with MOSFET transistors, with a p-channel MOSFET transistor forming the switch SW1 and n-channel MOSFET transistors forming the switches SW2 and SW3. In some embodiments measurement of the inductor current LI could be performed continuously or from time to time in any one of the switches SW1, SW2 and SW3.

Figure 4:
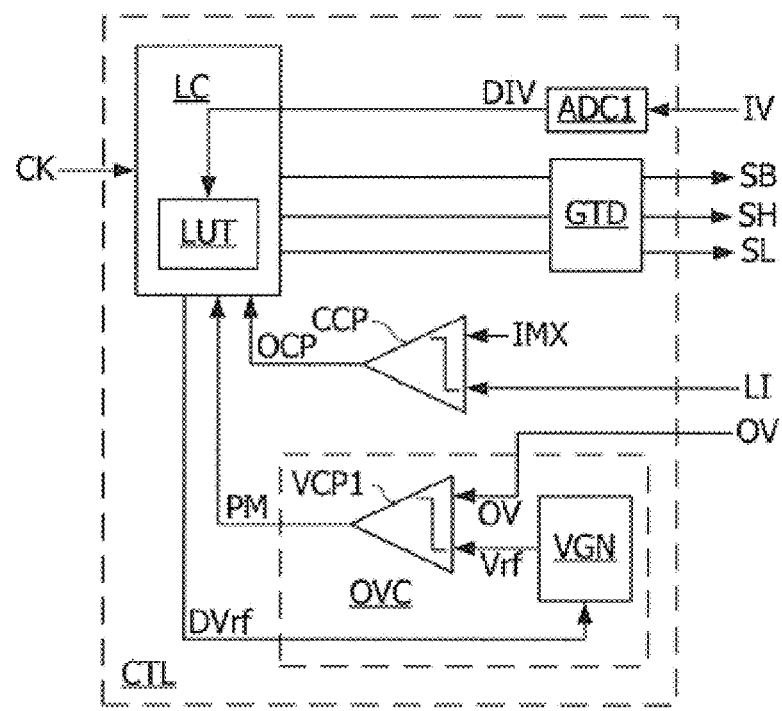
FIG. 4 is a circuit diagram of the control circuit CTL according to an embodiment, with for clarity of the Figure only showing control signals for a single phase of a multi-phase DC/DC switching converter.

FIG. 4 is a circuit diagram of the control circuit CTL according to an embodiment, with for clarity of the Figure only showing control signals for a single phase of a multi-phase DC/DC switching converter. The control circuit CTL comprises a logic circuit LC, an analog-to-digital converter ADC1, a current comparator CCP, a gate drive circuit GTD and a voltage comparator circuit OVC. The converter ADC1 receives the input voltage IV and converts this voltage into a digital signal DIV representative of the value of the voltage IV. The input voltage digital signal DIV is provided to the logic circuit LC. The current comparator CCP receives the current LI from the inductor L1 and a current maximum value IMX and provides to the logic circuit LC a binary signal OCP, for example equal to 1 or 0, as a function of the comparison result of the inductor current LI with the maximum value IMX. The circuit OVC comprises a reference voltage generator VGN and a voltage comparator VCP1. The comparator VCP1 receives the output voltage OV and a reference voltage Vrf from the generator VGN, and provides to the logic circuit LC a binary signal PM, for example equal to 1 or 0, as a function of the comparison result of the output voltage OV with the reference voltage Vrf. The value of the reference voltage Vrf may be adjusted by a digital signal DVrf corresponding to a digital value of the reference voltage Vrf, provided by the logic circuit LC to the voltage comparator circuit OVC. The logic circuit LC may include a look-up table LUT providing regulation parameters as a function of the digital values DIV and DVrf of the input voltage IV and the reference voltage Vrf. The logic circuit CTL receives a clock signal CK and is configured to generate the control signals SH, SL, SB with respect to the clock signal CK as a function of the signals OCP and PM (with corresponding control signals SH, SL, SB being similarly generated, but with respect to either different phases of the clock signal CK, for example as discussed with respect to FIG. 1, or different clock signals, for example as discussed with respect to FIG. 2). The gate drive circuit GTD1 is configured to appropriately adapt the control signals SH, SL, SB to control switches SW1, SW2 and SW3. The gate drive circuit GTD may be omitted if the switches SW1, SW2 and SW3 can be controlled directly by logical signals generated by the logic circuit LC. The logic circuit LC may be a wired logic circuit.

In some embodiments the control circuit operates the switches in a pulse width modulation mode when the output voltage is less than the reference voltage and operates the switches in a bypass mode (with the bypass switch SW3 closed and the high side and low side switches SW1, SW2 open) when the output voltage is greater than the reference voltage. In some embodiments the lookup table may determine a duty cycle for operations in pulse width modulation mode based on the input voltage IV and the reference voltage. In some embodiments the controller may also operate the switches in a pulse frequency mode of operation, for example in low load situations (as may be determined based on current to the load or inductor current, for example).

Figure 5:
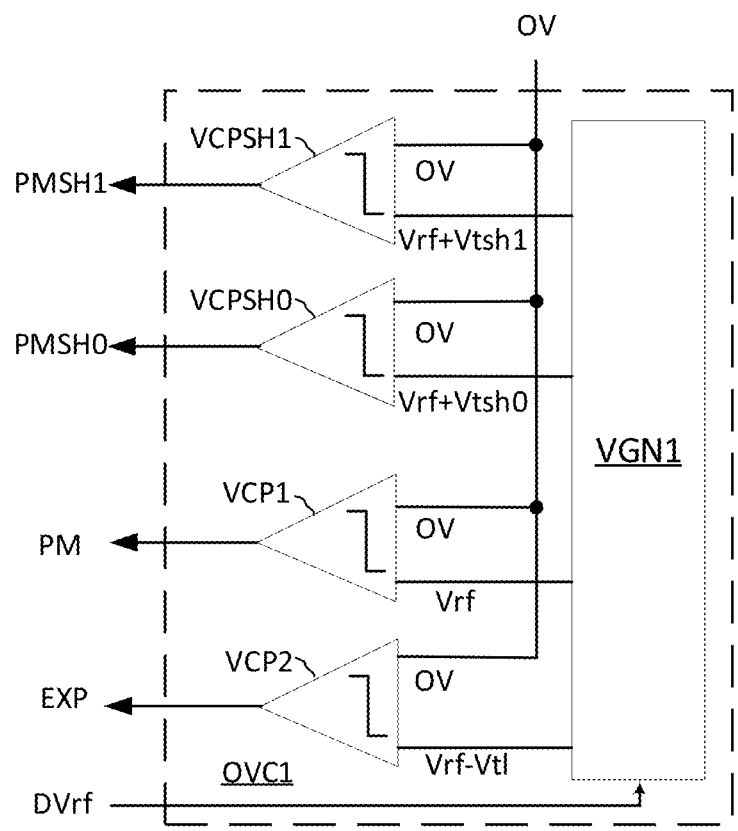
FIG. 5 is a circuit diagram of a further embodiment of the voltage comparator circuit according to another embodiment.

FIG. 5 is a circuit diagram of a further embodiment of the voltage comparator circuit according to another embodiment. The circuit diagram of FIG. 5 is similar to the OVC circuit of FIG. 4, but performs additional comparisons which may be utilized by the controller in operating the switches of a multi-phase DC/DC switching converter, for example the converters of FIGS. 1 and 2. The voltage comparator circuit OVC1 of FIG. 5 comprises a reference voltage generator VGN1, the voltage comparator VCP1 and another voltage comparator VCP2. The generator VGN1 is configured to generate a first reference voltage Vrf and a second reference voltage which may be derived from the reference voltage, e.g. equal to Vrf−Vtl. The voltage Vtl may be set to a fraction of the reference voltage Vrf, smaller than an admitted regulation error for the output voltage OV. The voltage Vtl is set for example to a value in the interval from 0.5% to 1.5% of the reference voltage Vrf. The comparator VCP1 receives the output voltage OV and the first reference voltage Vrf from the generator VGN1. The comparator VCP1 provides to the logic circuit LC the binary signal PM, for example equal to 1 or 0, as a function of the comparison result of the output voltage OV with the first reference voltage Vrf. The binary signal PM may be used to determine whether to operate the phases, or just some of the phases, in PWM mode (or PFM mode for low load levels) or bypass mode, as discussed with respect to FIG. 4. The comparator VCP2 is optional, and not used in some embodiments. The comparator VCP2 receives the output voltage OV and the second reference voltage Vrf−Vtl from the generator VGN1. The comparator VCP2 provides to the logic circuit LC a binary signal EXP for example equal to 1 or 0, as a function of the comparison result of the output voltage OV with the second reference voltage Vrf−Vtl. The signal EXP may be used by the logic circuitry to command the high side switch of one, some, or all phases to be closed, with the low side switches and bypass switch open, in the event of undervoltage situations.

The voltage comparator circuit of FIG. 5 additionally includes comparators VCPSH0 and VCPSH1. The comparators VCPSH0 and VCPSH1 compare the output voltage OV to a voltage Vrf+Vtsh0 and Vrf+Vtshl, respectively, and generate signals PMSH0 and PMSH1, respectively. The voltages Vrf+Vtsh0 and Vrf+Vtshl are generated by the reference voltage generator VGN1. In some embodiments the comparator VCPSH1 is omitted, and the signal PMSH1 is not generated or used. In some embodiments the logic circuitry uses outputs of the comparators for control of some phases of the multi-phase DC/DC switching converter. In some embodiments the signals PMSH0 and PMSH1 are used to operate some of the phases in PWM mode (or PFM mode for low load levels).

In some embodiments inductors of some of the phases have inductances greater than inductances of inductors of others of the phases. In some such embodiments the signal PM is used for operation of the some of the phases having inductors with the lower inductances, and the signals PMSH0 and PMSH1 are used for operation of the others of the phases having inductors with the greater inductances.

In some embodiments some of the phases are operated using a clock with a frequency less than a frequency of a clock used for operation of others of the phases, and in some embodiments the some of the phases are phases with inductors having inductances greater than inductances of the others of the phases. In some such embodiments the signal PM is used for operation of the some of the phases operated using the clock with the frequency higher than the frequency of the clock used for operation of the other phases.

Figure 6:
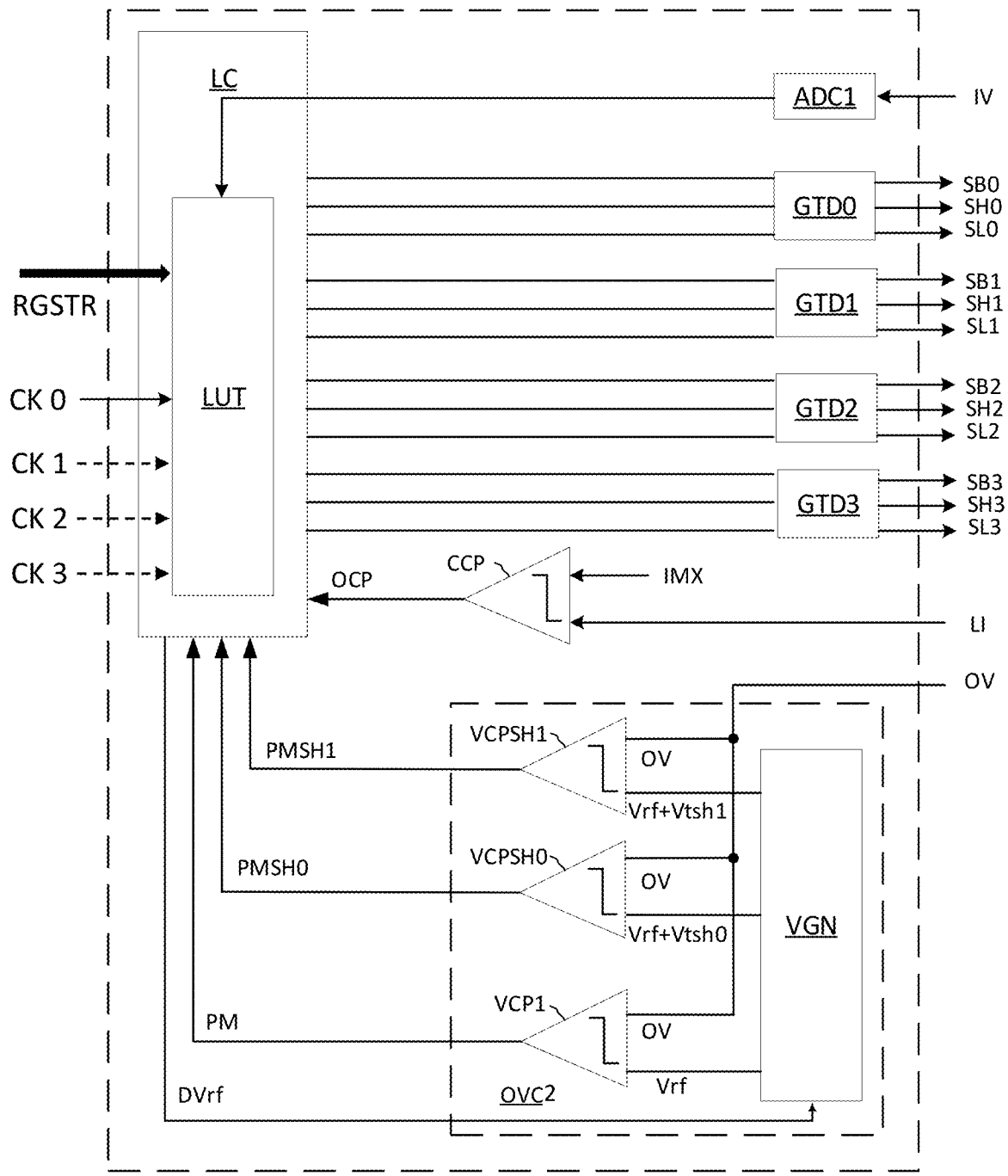
FIG. 6 is a circuit diagram of a further embodiment of a control circuit CTL for a multi-phase DC/DC switching converter, in accordance with aspects of the invention.

FIG. 6 is a circuit diagram of a further embodiment of a control circuit CTL for a multi-phase DC/DC switching converter, in accordance with aspects of the invention. The embodiment of FIG. 6 is for a multi-phase switching converter including four phases, in various embodiments other number of phases may be used. As with the embodiment of FIG. 4, the control circuit CTL includes a logic circuit LC, an analog-to-digital converter ADC1, a current comparator CCP, and a voltage comparator circuit OVC2. The logic circuit provides control signals to gate drivers GTD0-3, with each of the gate drivers providing drive signals for the bypass switch and power switches, namely the high side switch and low side switch, for each phase. The converter ADC1 receives the input voltage IV and converts this voltage into a digital signal DIV representative of the value of the voltage IV. The input voltage digital signal DIV is provided to the logic circuit LC. The current comparator CCP receives a signal indicative of current LI through the inductor L1 and a current maximum value IMX and provides to the logic circuit LC a binary signal OCP, for example equal to 1 or 0, as a function of the comparison result of the inductor current LI with the maximum value IMX. Although only a single comparator CCP is shown, in some embodiments there are comparators CCP0-3, with one comparator for each phase. The OCP signal may be considered an overcurrent signal, used by the control circuit in providing signals to the gate drivers for over current protection. The circuit OVC2 comprises a reference voltage generator VGN and voltage comparators VCP1, VCPSH0 and VCPSH1. The comparator VCP1 receives the output voltage OV and a reference voltage Vrf from the generator VGN, and provides to the logic circuit LC a binary signal PM, for example equal to 1 or 0, as a function of the comparison result of the output voltage OV with the reference voltage Vrf. The value of the reference voltage Vrf may be adjusted by a digital signal DVrf corresponding to a digital value of the reference voltage Vrf, provided by the logic circuit LC to the voltage comparator circuit OVC2. Similarly, the comparators VCPSH0 and VCPSH1 receive the output voltage OV and reference voltages Vrf+Vtsh0 and Vrf+Vtshl, respectively, and provide to the logic circuit LC signals PMSH0 and PMSH1, respectively, based on the results of the comparisons they perform. The logic circuit LC may include a look-up table LUT providing regulation parameters as a function of the digital values DIV and DVrf of the input voltage IV and the reference voltage Vrf.

The logic circuit CTL also receives a clock signal CK0. In some embodiments the logic circuit is configured to generate the control signals SH0-3, SL0-3, SB0-3 with respect to the clock signal CK0 and phase shifted versions of the clock signal, with different phase shifted ones of the clock signal used for different sets SHx, SLx, SBx (x being 0-3) as a function of the signals OCP and PM. The gate driver circuits GTD0-3 are configured to appropriately adapt the control signals SH0-3, SL0-3, SB0-3 to control the high side, low side, and bypass switches of the various phases. The gate driver circuits GTD0-3 may be omitted if the switches SW1, SW2 and SW3 can be controlled directly by logical signals generated by the logic circuit LC. The logic circuit LC may be a wired logic circuit.

In some embodiments the signal LI indicative of current in the inductor is also compared to a value indicative of zero current in the inductor. In some such embodiments, the logic circuitry is configured to only operate some of the phases during a succeeding clock cycle if the inductor current has gone to zero during an immediately preceding clock phase. In some embodiments the inductor current is the inductor current for that phase. In some embodiments the inductor current is the inductor current for a measured inductor. In some embodiments the inductor current is the inductor current for all of the phases. In some embodiments the some of the phases are the phases with inductors having higher or lower inductance values. In some embodiments the phases are the phases operated with respect to the PMSH0 and/or PMSH1 signals.

In some embodiments the logic circuit generates additional clock signals at a different frequency or frequencies for use in generating the control signals, with for example the logic circuit including a clock multiplier or a clock divider. In some embodiments the additional clock signals may have a frequency that is an integer multiple of the clock signal, or the clock signal may have a frequency that is an integer multiple of at least one of the additional clock signals. In some embodiments the clock signal or additional clock signals with higher frequencies are used in generating control signals for operation of phases with lower inductances, with lower frequency clock signals used in generating control signals for phases with higher inductances. In some embodiments, and as shown as optional in FIG. 6, the logic circuit additionally receives one, some, or all of clock signals CK1, CK2, and CK3, with each of the clock signals CK1, CK2, CK3 being at different frequencies. In some embodiments different ones of the clock signals are used in generating the control signals for the switches. In some embodiments the clock signals of CK0, CK1, CK2, CK3 with higher frequencies are used in generating the control signals for the switches of phases having inductors with lower inductances, and the clock signals of CK0, CK1, CK2, CK3 with lower frequencies are used in generating the control signals for the switches of phases having inductors with higher inductances.

In some embodiments the control circuit operates the switches in a pulse width modulation mode when the output voltage is less than the reference voltage and operates the switches in a bypass mode (with the bypass switch SW3 closed and the high side and low side switches SW1, SW2 open) when the output voltage is greater than the reference voltage plus predetermined positive or negative threshold. In some embodiments the lookup table may determine a duty cycle for operations in pulse width modulation mode based on the input voltage IV and the reference voltage. In some embodiments the controller may also operate the switches in a pulse frequency mode of operation, for example in low load situations (as may be determined based on current to the load or inductor current, for example).

In some embodiments, and as illustrated in FIG. 6, the logic circuitry receives information stored in registers of the switching converter. In some embodiments the information includes information indicating inductance, or relative inductance, of inductors of the different phases, and/or clock frequencies, or relative clock frequencies, for clock signals to be used in operation of the different phases, and/or information as to a number of transistors or groups of transistors to be used in operation of the switches for the different phases. For example, it is understood that the high side switches and the low side switches may include a plurality of transistors, for example in parallel. Depending on information of the registers, for example inductance or relative inductance of the inductors, different numbers of transistors may be used for the switches in operation of the phases. In some embodiments the registers may be part of the logic circuitry LC, or associated with the logic circuitry LC. In some embodiments the information stored in the registers may be stored upon initial provision of power to the control circuit. In some embodiments the information may be stored in memory other than registers.

In some embodiments, for example, the inductors of the phases may have an expected nominal inductance, but the actual inductance may vary for a variety of reasons, for example due to manufacturing variances or for other reasons like temperature or load current. The registers or other memory, therefore, may store actual measured inductance of the inductors at a known condition, or relative measured inductance of the inductors. In some embodiments the inductors determined to have greater inductance or lesser inductance may be determined, on a device basis, by the control circuit.

In some embodiments the DC/DC switching converter may also dynamically determine inductance, or relative inductance, of the inductors. For example, in some embodiments the high side switch may be closed, on a phase-by-phase basis, for a predetermined period time, and change in output voltage of the switching converter measured to arrive at an indication of inductance for each phase, or relative inductance between phases.

Although the invention has been discussed with respect to various embodiments, it should be recognized that the invention comprises the novel and non-obvious claims supported by this disclosure.

The invention claimed is:

1. A multi-phase DC/DC switching converter comprising:
a plurality of phases, with each phase of the plurality of phases including at least one high side switch and at least one low side switch coupled in series between an input voltage source and a lower voltage source, an output inductor with a first end coupled to a node between the at least one high side switch and the at least one low side switch and a second end providing an output, and a bypass switch coupling the first end and the second end of the output inductor, with a nominal inductance of at least one of the output inductors different than nominal inductance of at least one other of the output inductors;
a comparator for comparing voltage of the output voltage and a reference voltage; and
a controller configured to command operation of the at least one high side switch, the at least one low side switch, and the bypass switch of each phase of the plurality of phases based on an output of the comparator and a clock signal, the clock signal being one of a plurality of different clock signals differing in frequency for at least some of the phases of the plurality of phases;
wherein sizes of the at least one high side switch of different ones of the phases of the plurality of phases differ in relation to differences in frequency for the clock signal to be used in operating the at least one high side switch, the at least one low side switch, and the bypass switch of different ones of the phases of the plurality of phases.

2. The multi-phase DC/DC switching converter of claim 1, wherein sizes of the at least one high side switch of different ones of the phases of the plurality of phases differ in relation to differences in inductance of the output inductors of the different ones of the phases of the plurality of phases.

3. A multi-phase DC/DC switching converter, comprising:
a plurality of phases, with each phase of the plurality of phases including at least one high side switch and at least one low side switch coupled in series between an input voltage source and a lower voltage source, an output inductor with a first end coupled to a node between the at least one high side switch and the at least one low side switch and a second end providing an output, and a bypass switch coupling the first end and the second end of the output inductor, with inductance of at least one of the output inductors different than inductance of at least one other of the output inductors;

a first comparator for comparing output voltage and a reference voltage;

an additional comparator for comparing output voltage and the reference voltage plus a threshold; and a controller configured to command operation of the at least one high side switch, the at least one low side switch, and the bypass switch of some of the phases of the plurality of phases based on an output of the first comparator and at least a first clock signal, to command operation of the at least one high side switch, the at least one low side switch, and the bypass switch of one or more others of the phases of the plurality of phases based on an output of the additional comparator and at least a second clock signal, the second clock signal differing in frequency from the first clock signal.

4. The multi-phase DC/DC switching converter of claim 3, wherein sizes of the at least one high side switch of different ones of the phases of the plurality of phases differ in relation to differences in inductance of the output inductors of the different ones of the phases of the plurality of phases.

5. The multi-phase DC/DC switching converter of claim 3, wherein the sizes of the at least one high side switch of different ones of the phases of the plurality of phases differ in relation to differences in frequency for the clock signal to be used in operating the at least one high side switch, the at least one low side switch, and the bypass switch of different ones of the phases of the plurality of phases.

6. The multi-phase DC/DC switching converter of claim 5, wherein sizes of the at least one high side switch of different ones of the phases of the plurality of phases differ in relation to differences in inductance of the output inductors of the different ones of the phases of the plurality of phases.

7. The multi-phase DC/DC switching converter of claim 3, wherein the controller is configured to command operation of the at least one high side switch, the at least one low side switch, and the bypass switch of the one or more others of the phases of the plurality of phases only in a discontinuous conduction mode (DCM) of operation.

8. The multi-phase DC/DC switching converter of claim 3, wherein the controller is configured to command operation of the at least one high side switch, the at least one low side switch, and the bypass switch of the some of the phases of the plurality of phases only in a discontinuous conduction mode (DCM) of operation.

9. The multi-phase DC/DC switching converter of claim 3 wherein the first clock frequency is lower than the second clock frequency.

10. The multi-phase DC/DC switching converter of claim 9, wherein the controller is configured to determine relative inductance of the output inductors of the plurality of phases.

11. The multi-phase DC/DC switching converter of claim 10, wherein the controller is configured to change a duty cycle of operation of the at least one high side switch, the at least one low side switch, and the bypass switch based on the determined relative inductance of the output inductors of the plurality of phases.

12. The multi-phase DC/DC switching converter of claim 10, wherein the controller is configured to select at least one clock signal for use in operating the at least one high side switch, the at least one low side switch, and the bypass switch of at least one phase of the plurality of phases based on the determined relative inductance of the output inductors of the plurality of phases.

13. The multi-phase DC/DC switching converter of claim 3, wherein output inductors of the some of the phases of the plurality of phases have larger inductances than output inductors of the one or more others of the phases of the plurality of phases.

14. The multi-phase DC/DC switching converter of claim 13, wherein output inductors of the some of the phases of the plurality of phases have a same nominal inductance as output inductors of the one or more others of the phases of the plurality of phases.

15. The multi-phase DC/DC switching converter of claim 13, wherein output inductors of the some of the phases of the plurality of phases have a different nominal inductance than output inductors of the one or more others of the phases of the plurality of phases.

* * * * *